United States Patent [19]

Silver

[11] Patent Number: 5,272,479
[45] Date of Patent: Dec. 21, 1993

[54] HIGH SENSITIVITY SUPERCONDUCTIVE DIGITIZER

[75] Inventor: Arnold H. Silver, Rancho Palos Verdes, Calif.

[73] Assignee: TRW Inc., Redondo Beach, Calif.

[21] Appl. No.: 918,518

[22] Filed: Jul. 22, 1992

[51] Int. Cl.$^5$ .......................................... H03M 1/00
[52] U.S. Cl. .................................... 341/133; 341/171
[58] Field of Search ................................ 341/133, 171

[56] References Cited

U.S. PATENT DOCUMENTS

| | | | |
|---|---|---|---|
| 4,672,359 | 6/1987 | Silver | 341/171 |
| 4,879,488 | 11/1989 | Silver | 341/171 |
| 5,012,243 | 4/1991 | Lee | 341/133 |
| 5,019,818 | 5/1991 | Lee | 341/133 |

*Primary Examiner*—Marc S. Hoff
*Attorney, Agent, or Firm*—Sol L. Goldstein; G. Greg Schively

[57] ABSTRACT

A high-sensitivity superconductive digitizer (10) which utilizes a dc superconducting quantum interference device (SQUID) (38) to convert an input current or magnetic flux into a frequency signal which is converted by a counter (60) into a digital representation of the input. This measurement requires that the SQUID (38) be operated in a linear region of its periodically varying output. To insure locking the system into a fixed point in the periodic signal, a digital flux-locked loop is employed which utilizes a digital integrator (70) and digital to analog converter (72) in a feedback loop. A waveform generator (46) produces a dithering modulation waveform in the SQUID (38) and an up-down counter (60) finds difference signals between alternating waveforms. This difference signal is then fed to a digital integrator (70) and converted to analog by a digital to analog converter (72) and fed back to the SQUID in a feed-back loop to lock the SQUID (38) to a fixed operating point.) The analog to digital converter (10) of the present invention offers very high sensitivity with low power dissipation and very high speed.

12 Claims, 3 Drawing Sheets

HIGH SENSITIVITY SUPERCONDUCTIVE DIGITIZER

BACKGROUND OF THE INVENTION

1. Technical Field

This invention relates to devices for sensing low level analog signals, and particularly to a Josephson junction superconducting quantum interference device (SQUID) analog to digital converter.

2. Discussion

The problem of sensing low level analog signals and their conversion to a digital format for subsequent digital processing is important in a number of fields including magnetic imaging, nondestructive testing, magnetometers, gradiometers, infrared detectors and focal plane arrays, millimeter-wave detectors and arrays, and low-level instrumentation. In these applications, the analog signal is a low level current or magnetic field, and performance parameters such as power dissipation, linearity, noise, dynamic range, bandwidth and slew rate are important.

Extremely sensitive magnetometers have been developed using superconducting quantum interference devices (SQUIDS) which consist of two Josephson tunnel junctions connected in parallel on a superconduction loop. SQUID-counter based analog to digital converters (ADCs) generally rely on the application of fundamental properties of Josephson junction SQUIDS and techniques for manipulation of single (magnetic) flux quanta (SFQ) and superconducting integrated circuits such as SFQ counters and digital logic. SQUID counter-based ADCs usually have a least-significant-bit (lsb) which is the current required to produce a change of one flux quantum ($\Phi_0 = 2.07 \times 10^{-15}$ WEBERS) in the SQUID:

$$I_{lsb} = \Phi_0/M$$

where M is the mutual inductance between the input transformer (T) and the SQUID inductance. In prior ADC systems, the quantizing SQUIDs are operated in the zero voltage state, and the signal current produces SFQ changes which are detected either (1) by counting the number of transitions of a single SQUID with a SQUID flip-flop, or (2) by strobing an array of binary-coupled SQUIDs above a fixed gate current and decoding the voltage pattern. However, in general, prior SQUID ADCs have poor current sensitivity. Power dissipation, dynamic range, linearity and slew rate are also important considerations in the performance of SQUID ADCs.

Conventional analog SQUID sensors, used as magnetometers, gradiometers, or general galvanometers, are commonly implemented in a "flux-locked" mode which linearizes the basic periodic response of the SQUID by using analog signal processing and feedback. However, this technique frequently reduces the basic sensitivity and bandwidth.

Thus, it would be desirable to provide a SQUID ADC which provides significant improvements in sensitivity and dynamic range. Also, it would be desirable to have such a SQUID ADC which operates at high speed with minimum power dissipation.

SUMMARY OF THE INVENTION

Pursuant to the present invention, a high sensitivity superconductive analog to digital converter is provided. The ADC includes a coil for receiving an input signal current and converting the current to a magnetic flux, as well as a waveform generator for generating a three-state modulating magnetic flux signal modulating between positive, negative and zero states. Also, a DC superconducting quantum interference device receives as inputs the magnetic flux from both the coil and the waveform generator, and produces a pulse train $F_s$ which has a frequency that is a periodic function of its inputs. The DC SQUID in this invention is operated continuously in the voltage state, compared with other superconductive ADCs in which the SQUIDs operate in the zero-voltage state. Operation in the voltage state is achieved by impressing an external gate current greater than the critical current of the SQUID. A switch, controlled by the waveform generator, synchronously gates pulses from the SQUID to either the up-counting or down-counting terminals of an up-down counter. The up-down counter is provided for generating an output which represents the difference between the pulse frequency of the SQUID during the positive and negative states of the modulation cycle, the periodic SQUID output having an extrema point falling between the positive and negative signals. A digital integrator integrates the up-down counter difference signal output. A digital to analog converter receives the integrated difference signal from the integrator and provides an analog feedback magnetic flux proportional to the integrator output, wherein the SQUID signal input magnetic flux is cancelled and the SQUID is flux-locked back to an operating point at the extrema. A digital filter also receives the digital integrator output and produces a digital output representative of the accumulated changes in the input current.

BRIEF DESCRIPTION OF THE DRAWING

The various advantages of the present invention will become apparent to one skilled in the art by reading the following specification and by reference to the following drawings in which.

DESCRIPTION OF THE PREFERRED EMBODIMENT

Figure 1:
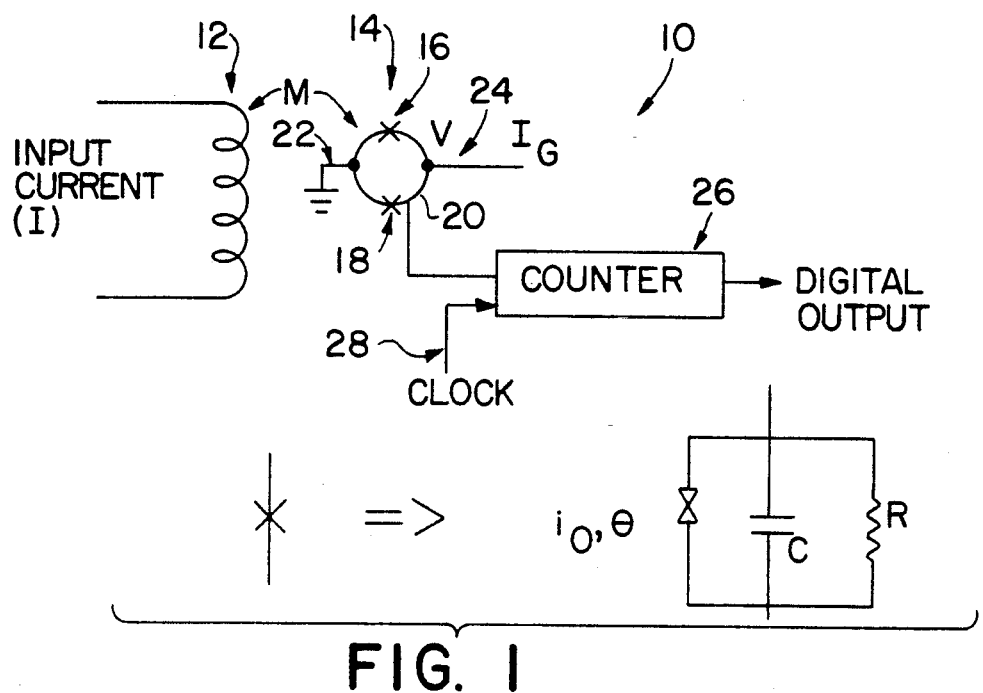
FIG. 1 is a diagram of the basic concept of analog to digital conversion in accordance with the present invention.

Referring now to FIG. 1, there is shown a diagram of the main components of the SQUID ADC 10 in accordance with the present invention. Input current I is fed to a field coil 12, which introduces a mutual inductance M between the coil 12 and a SQUID 14. The SQUID 14 includes two Josephson junctions 16 and 18 connected in parallel on a superconduction loop 20. The SQUID 14 is operated with a constant bias current $I_G$ (gate current) and in this configuration is referred to as a dc SQUID. The SQUID also includes a ground terminal 22. The junctions 16 and 18 are damped so that the junctions do not switch to and latch at the gap voltage.

It will be appreciated that a Josephson junction is a precise frequency to voltage converter. In the present invention, the SQUID is operated as a three terminal transimpedance amplifier in the voltage state. Due to the ac Josephson effect, the SQUID 14 in FIG. 1 will oscillate at a frequency determined by the relation:

$$V = \Phi_0 f$$

where V is measured at the line 24 where the current is applied, $\Phi_0 = 2.07 \times 10^{-15}$ Weber, and f is the frequency of oscillation. The small dc voltages across the junctions 16, 18 in the SQUID 14 are produced by precise high-frequency oscillations of the current in the junctions and the SQUID. Each oscillation pulse represents the transfer of one single (magnetic) flux quanta (SFQ) through the SQUID inductance and each junction according to the above equation.

In the present invention the oscillation frequency is counted using an SFQ counter 26. The relevant frequency scale is given by $f \approx 483.6$ MHz/$\mu$V. It will be appreciated that the constant of proportionality is known to better than $10^{-6}$ and is the basis to the U.S. Standard Volt. Therefore, if $V_{min}$ is 1$\mu$V, measurement times as short as 1$\mu$s will produce $\approx 500$ counts. If $V_{max}$ is 11$\mu$V, there will be $\approx 5,500$ counts in the same counting interval. Intermediate voltages will produce precisely proportional intermediate frequencies and counts. Thus the dc transfer characteristic of the SQUID 14 is a periodic voltage with an approximately triangular waveform, as shown in FIG. 2.

Figure 2:
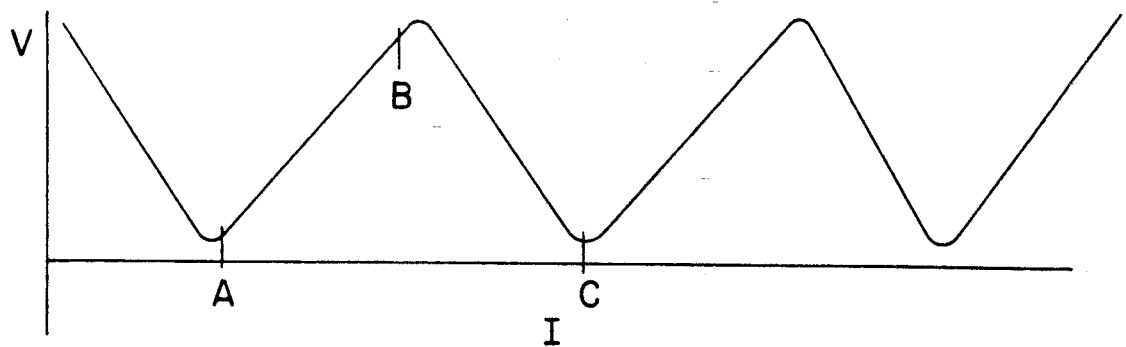
FIG. 2 is a graph of the DC transfer characteristics of the SQUID used in the present invention.

The basic operation of the SQUID ADC 10 in accordance with the present invention is along one region of this curve, such as between points A and B as shown in FIG. 2, although other regions may be used. In FIG. 2, V is the voltage as measured on line 24 in FIG. 1 and I is the input current also shown in FIG. 1. The voltage range from A to B is typically 1 to 10V. The precise values depend on the device parameters and are well known to those skilled in the art. SQUIDs have been reported that can distinguish analog signal changes as small as $10^{-6} I_{lsb} Hz^{\frac{1}{2}}$.

From numerous fundamental measurements of the Standard Volt, the value and variance of the frequency of SQUID oscillation is precisely that of the voltage. This is limited by noise in the input signal current, a very small added SQUID noise, and Johnson noise in the effective damping resistance across the junctions in the SQUIDs. These variations combine to set the effective least significant bit (lsb) input signal current and the corresponding output voltage/frequency. The dynamic range will be $$DR = (V_{max}/V_{min})/V_{lsb}$$

This configuration avoids the need for low noise amplifiers and analog electronics to amplify the SQUID output signal and drive a subsequent ADC. The SQUID in the present invention serves as a low noise transimpedence amplifier and noise-free digitizer. The counter 26 and clock signal 28 encode the digitized signal into binary. Subsequent digital electronics, either superconducting or conventional semiconductor, may then be used to set the zero level and binary scale.

Conventional analog SQUID sensors used as magnetometers, gradiometers, or general galvanometers, are commonly implemented in a "flux-locked" mode which linearizes the basic periodic response of FIG. 2 by using analog signal processing and feedback. Also, flux-locking is desired because the flux-locked point is essentially invariant to a number of operating conditions. For example, it is invariant to the gate current. If that current changes, the position in the external signal of the minima flux-locked point should not change. Also, if the temperature changes, the minima and maxima points will not change either. Unfortunately, analog flux-locking typically reduces the basic sensitivity and bandwidth. In accordance with a preferred embodiment of the present invention, a technique is presented that implements digital processing and feedback to linearize the response function and preserve the sensitivity and bandwidth.

Figure 3:
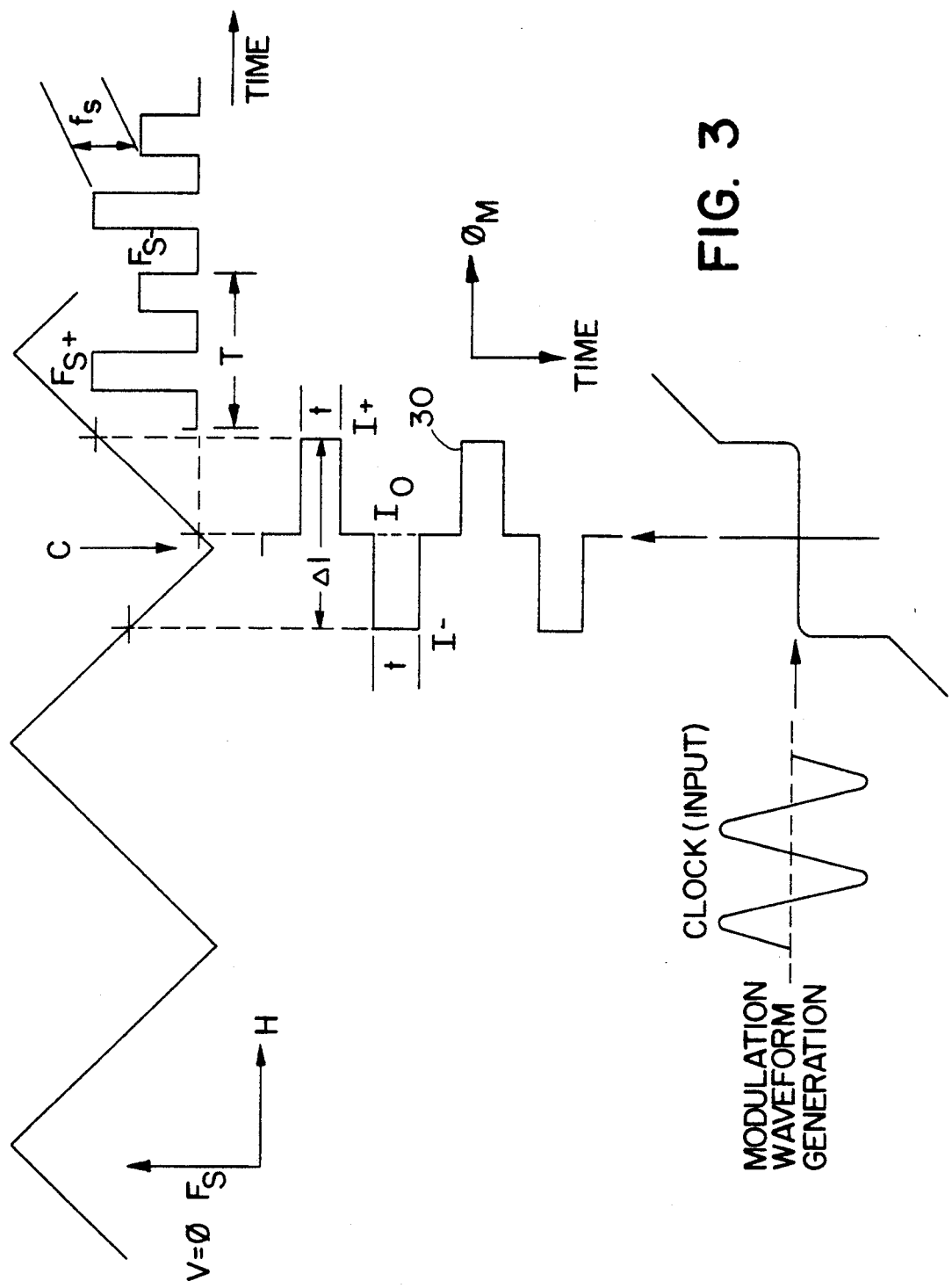
FIG. 3 is a signal diagram illustrating the modulation signal used for the analog to digital convertor in accordance with the present invention.

In more detail, the present invention utilizes a digital "flux-locked" loop (DFLL) which is based on locking the SQUID 14 operating point to one of the turning points or extrema of the SQUID periodic characteristics. Referring now to FIG. 3, this is done by introducing a small dither or modulation current 30 with peak-to-peak STET amplitude of $\Delta I < \Phi_0/2M$ applied to the SQUID. This waveform has three fixed current values ($I_+$, $I_0$, and $I_-$), which will produce three different voltage/frequencies in the SQUID output. By counting the frequency during $I_+$ ($F_{s+}$) and $I_-$ ($F_s$), then the difference frequency $\Delta f = f_s$ can be determined which represents the offset of the operating point from the desired flux-locked point. If the operating point is precisely at the extrema (ie. Point C in FIG. 3), then $F_{2+} = F_{s-}$. The error signal $\delta f$ can be derived either by direct algebraic subtraction or by using a bidirectional up-down counter. The binary error signal is then converted into a high-speed analog feedback current by means of a digital to analog converter. In order to maintain lock at the proper point, the $\delta f$ from each clock cycle is added to the binary number in the digital to analog converter register. This has the effect of integrating the error signal and accumulating the changes in the input analog signal.

Figure 4:
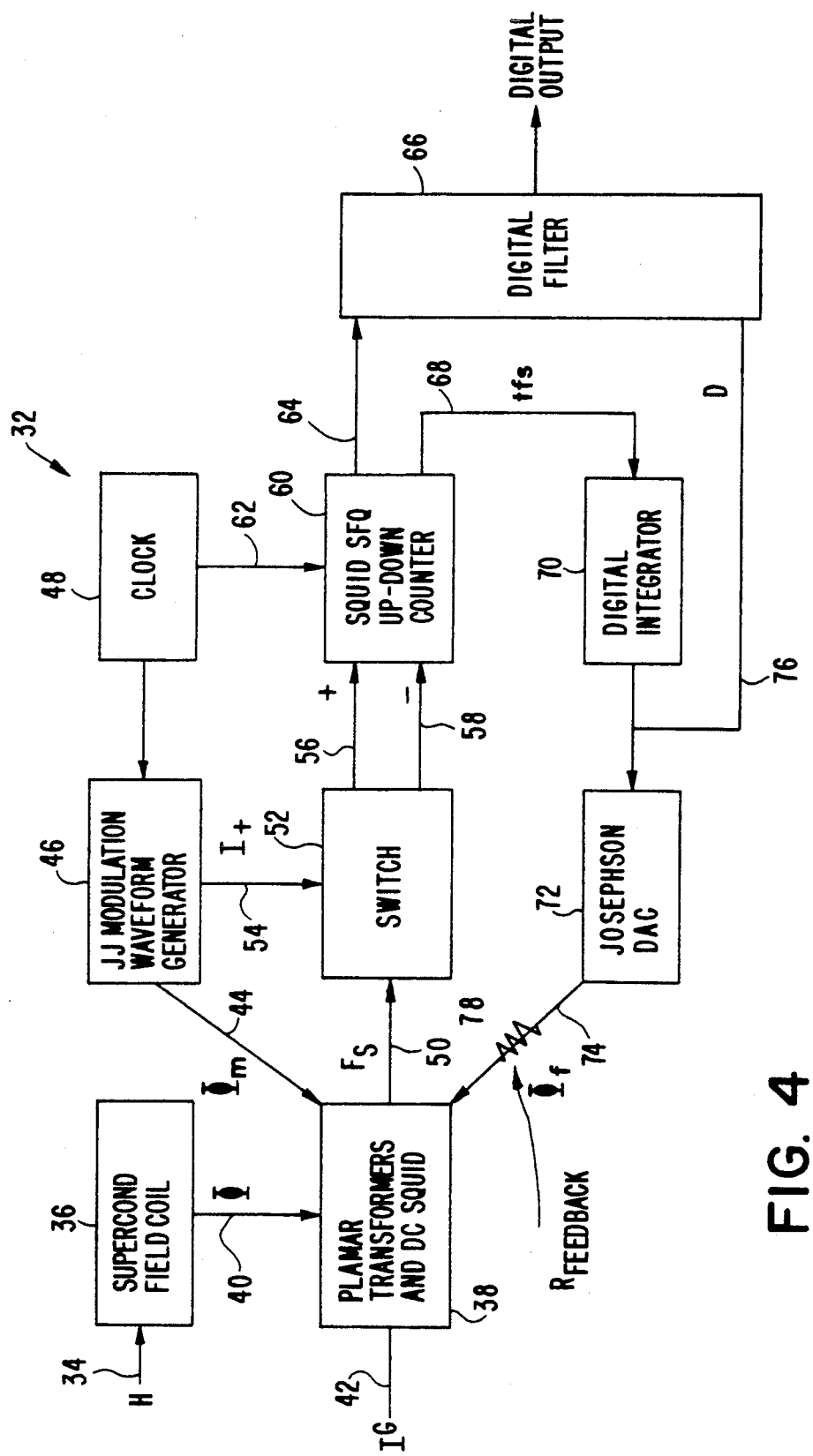
FIG. 4 is a block diagram of the preferred embodiment of the SQUID analog to digital converter in accordance with the present invention.

Referring now to FIG. 4, a preferred embodiment of a SQUID analog to digital converter 32, in accordance with the present invention is shown. An input current I (or alternatively a magnetic field H), is fed along an input line 34 to a superconducting field coil 36. The superconducting field coil 36 acts as a transformer to couple the magnetic field H to a dc SQUID 38. That is, the superconducting field coil produces a magnetic flux $\Phi$ along line 40, which is sensed by planar transformers coupled to the dc SQUID 38. As shown in FIG. 1, a gate current $I^G$ is applied to the SQUID along line 42. The input magnetic flux 101 is modulated by an rf square wave $\Phi_m$ along path 44 generated by a Josephson junction modulation waveform generator 46. The period of modulation of the waveform generator 46 is set by clock 48.

As discussed above, the dc SQUID will produce a pulse train $F_s$ along line 50 to a switch 52, which is a gated diplexer. That is, switch 52 is controlled by the state of the waveform generator 46. When the waveform generator 46 outputs $I_+$ (along line 54), the switch passes pulses from the input line 50 to line 56 and thence to the up-counting terminal of the counter 60. When the waveform generator 46 outputs $I_-$, the switch 52 passes pulses from the output line 50 to line 58 and thence to the downcounting terminal of the counter 60. When the waveform generator 46 outputs $I_0$, the switch 52 passes pulses into neither line 56 nor line 58.

The $F_{s+}$ and $F_{s-}$ signals are received by a SQUID single flux quanta (SFQ) up-down counter 60 which is switched for a time t each clock cycle by a signal from clock 48 along line 62 to generate $F_{s+}$ and $F_{s-}$ frequency values and to produce the binary value of the difference signal t $f_s = F_{s+} - F_{s-}$ after each clock.

The counter digital output $I = tf_s$ is transmitted along line 64 to a digital filter 66. In more detail, the digital filter 66 comprises a circuit which removes the digital frequency components which are beyond the desired signal bandwidth. In addition, the digital filter uses appropriate weights to add the value of the counter output I and the corresponding digital integrator 70 output D to construct an extended precision digitization of the analog signal.

Also, the counter output $tf_s$ is sent along line 68 to a digital integrator 70 which drives a Josephson digital to analog converter 72 which produces an analog feedback magnetic flux $\Phi_f$ proportional to the algebraic sum of $tf_s$ over the operational time. $\Phi_f$ is then transmitted along line 74 back to the dc SQUID 38 to bring the SQUID to the nearest stable operating point at the minima (for example point C in FIG. 3) of the SQUID voltage-magnetic field characteristic. The output of the digital integrator 70 is also transmitted along line 76 to the digital filter 66 which produces a digital output that constitutes a measurement of the input signal along line 34.

It should be noted that the accuracy of establishing $tf_s = 0$ is limited by the lsb of the DAC and that consequently the system will "hunt" about the true value. Interpolation between the DAC lsb settings is achieved each clock cycle by measuring the binary number $tf_s$, which is smaller than the DAC lsb when the loop is closed. The interpolation value $I = tf_s$ is added as lesser significant bits to the DAC output to produce the limiting sensitivity of the SQUID sensor. In the flux-lock mode, the measured $F_s$ and $f_s$ are very linear in H over the small range between DAC lsb settings. The full scale capability of the DAC 72 is set between $\pm \Phi_0/2$ and $\pm \phi_0$ to maximize sensitivity. Overflow (underflow) will be recorded as a binary change $\pm \Phi_0$ and the SQUID operating point will be set to the next minimum value of $V_s$.

The digital phase locked loop in the analog to digital convertor 10 will maintain lock-up to a maximum excursion of the input and a corresponding maximum value of the feedback as set by the digital to analog convertor 10 and subsequent resistor network 78. The digital to analog convertor 10 and analog feedback resistors 78 also set the sensitivity since the system cannot lock within the lsb of the DAC 72. Sensitivity beyond this limit can be achieved in this invention by digital interpolation between the lsb of the DAC 72. In this case, there will be a digital error signal that cannot be compensated. Assuming, for example, that the DAC resolves 10 bits for each period of the basic SQUID characteristic, then the uncompensated signals are within approximately 0.05% ($2^{-11}$) of the SQUID $\Phi_0/M$. This is because the feedback mechanism will adjust the DAC to the closest value for compensation, but the limited resolution of the DAC makes errors up to $\frac{1}{2}$ lsb unavoidable. The measurements are made at a linear portion of the f-I curves as determined by the modulation signal. The present invention uses a digital signal $\delta f$ as a digital interpolation. The dynamic range of the digital flux-locked loop can be increased indefinitely by determining the over-flow of the DAC 72 and recording an integral value of the SQUID period $I_{lsb}$. That is, a signal excursion sufficient to exceed $\Phi_0$ be in the SQUID. If the most significant bit (msb) of the DAC 72 corresponds to one period of the SQUID, then the SQUID will reset at the next extremum value.

From the foregoing it can seem that the present invention has a number of advantages over other SQUID ADCs. Notably, the analog to digital converter 10 of the present invention provides more than 1000 times greater current sensitivity (i.e. gain) with no added noise. It will also be appreciated that there are several ways to implement the basic concepts of the present invention. For example, instead of using the up-down counter 60 shown in FIG. 4, a direct algebraic subtraction of $F_{s+}$ and $F_{s-}$ may be employed to yield the error signal $\delta f$. Other potential variations include extension of the digital filter 66 to include DAC nonlinearity compensation and digital filtering using memory of previous digitizations. It will be appreciated that the present invention with the digital flux-locked loop can be used to replace a variety of analog electronics in SQUID circuits.

Those skilled in the art can appreciate that other advantages can be obtained from the use of this invention and that modification may be made without departing from the true spirit of the invention after studying the specification, drawings, and following claims.

What is claimed is:

1. A superconductive analog to digital converter comprising:
   a coil for receiving an input current and converting said current into a magnetic flux;
   waveform generator means for generating a binary modulating magnetic flux signal having two distinct pulse levels;
   a direct current superconducting quantum interference device (SQUID) receiving the magnetic flux from both said coil and said waveform generator as inputs and producing a pulse train output ($F_s$) which has a frequency that is a periodic function of said inputs;
   switch means coupled to said SQUID output and to said waveform generator for generating positive ($F_{s+}$) and negative ($F_{s-}$) pulse trains each corresponding to the pulse train output ($F_s$) during the generation of one of the two distinct pulse levels;
   up-down counter means coupled to said switch means for generating a difference signal output which represents the difference between the two positive ($F_{s+}$) and negative ($F_{s-}$) signal pulses, said periodic SQUID output having an extrema point existing between said two distinct pulse levels;
   digital integrator means for generating an output representing an integration of said up-down counter difference signal output;
   digital to analog converter means for receiving said digital integrator output and producing an analog feedback magnetic flux proportional to the digital integrator output wherein said SQUID input magnetic flux is cancelled and said SQUID is flux-locked back to an operating point at said extrema; and
   digital filter means receiving said digital integrator output for producing a digital output proportional to the accumulated change in said put current.

2. The analog to digital converter of claim 1 wherein said switch means is a gated duplexer.

3. The analog to digital converter of claim 1 wherein said coil is a superconducting field coil.

4. The analog to digital converter of claim 1 wherein said waveform generator is a Josephson junction waveform generator.

5. The analog to digital converter of claim 1 further comprising planar transformers coupled to said SQUID for feedback and control of SQUID operating point.

6. The analog to digital converter of claim 1 further comprising a clock coupled to said waveform generator for triggering said modulation signal at a clock period T, and also coupled to said up-down counter for switching said counter on for a measurement time period t to measure the frequency of the SQUID output during said first and second modulation pulses.

7. The analog to digital converter of claim 1 wherein said up-down counter is a SQUID single flux quanta up-down counter.

8. The analog to digital converter of claim 1 wherein said digital to analog converter is a Josephson junction digital to analog converter.

9. The analog to digital converter of claim 1 wherein said up-down counter also produces an interpolation value output which is transmitted to said digital filter, and wherein said digital filter adds said interpolation value as lesser significant bits to the digital to analog converter output, whereby the limiting sensitivity of the analog to digital converter is produced.

10. The analog to digital converter of claim 1 further comprising means for clamping said SQUID.

11. The analog to digital converter of claim 1 further comprising means for generating a gate-current dc bias in said SQUID.

12. A superconductive analog to digital converter comprising:

a coil for receiving an input current and converting said current into a magnetic flux;

waveform generator means for generating a binary dithering modulating magnetic flux signal having positive and negative values;

a dc superconducting quantum interference device (SQUID) receiving the magnetic flux from both said coil and said waveform generator as inputs and producing a pulse train ($F_s$) which has a frequency that is a periodic function of said input;

switch means coupled to said SQUID output and to said waveform generator for generating positive ($F_{s+}$) and negative ($F_{s-}$) pulse trains each corresponding to the pulse train output ($F_s$) during the generation of one of the two district pulse levels;

means coupled to said switch means for subtracting the positive and negative pulse trains and producing a difference signal output which represents the difference between the frequency of the SQUID output resulting from said positive and negative modulation signals, said periodic SQUID output having an extrema point between said positive and negative signals;

digital integrator means for generating an output representing an integration of the output of said means for subtracting;

digital to analog converter means for receiving said integrator output and producing an analog feedback magnetic flux proportional to said integrator output, wherein said SQUID input magnetic flux is cancelled and said SQUID is flux-locked back to an operating point at said extrema; and digital filter means receiving said digital integrator output and producing a digital output proportional to the accumulated change in said input current.

* * * * *